(12) United States Patent
Ushijima

(10) Patent No.: US 8,648,462 B2
(45) Date of Patent: Feb. 11, 2014

(54) SEMICONDUCTOR POWER MODULE

(75) Inventor: Koichi Ushijima, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/114,475

(22) Filed: May 24, 2011

(65) Prior Publication Data

US 2012/0043652 A1 Feb. 23, 2012

(30) Foreign Application Priority Data

Aug. 18, 2010 (JP) ................................. 2010-182727

(51) Int. Cl.
*H01L 23/34* (2006.01)
*H05K 7/20* (2006.01)

(52) U.S. Cl.
USPC ........... 257/717; 257/713; 257/719; 257/722; 257/E23.088; 257/E23.103; 361/697; 361/703

(58) Field of Classification Search
USPC ............ 257/712, 713, 717, 719, 722, E23.08, 257/E23.081, E23.088, E23.101, E23.102, 257/E23.103, E23.105; 361/697, 703, 361/679.47, 679.52; 174/15.2
See application file for complete search history.

(56) References Cited

U.S. PATENT DOCUMENTS

| | | | | |
|---|---|---|---|---|
| 2,754,455 | A * | 7/1956 | Pankove | 257/714 |
| 3,739,234 | A * | 6/1973 | Bylund et al. | 257/715 |
| 3,834,454 | A * | 9/1974 | Gammel et al. | 165/80.4 |
| 3,978,518 | A * | 8/1976 | Kessler et al. | 257/715 |
| 4,386,362 | A * | 5/1983 | Kessler et al. | 257/715 |
| 6,005,772 | A * | 12/1999 | Terao et al. | 361/699 |
| 6,845,012 | B2 * | 1/2005 | Ohkouchi | 361/704 |
| 7,417,858 | B2 * | 8/2008 | Ouyang | 361/699 |
| 2004/0144996 | A1* | 7/2004 | Inoue | 257/200 |
| 2007/0064396 | A1* | 3/2007 | Oman | 361/700 |

(Continued)

FOREIGN PATENT DOCUMENTS

| | | | | | |
|---|---|---|---|---|---|
| JP | 01155150 | A | * | 6/1989 | ............... F25B 9/00 |
| JP | 03175479 | A | * | 7/1991 | ............... G09F 9/00 |

(Continued)

OTHER PUBLICATIONS

Notification of Reason for Refusal issued Nov. 12, 2013 in Japanese Patent Application No. JP 2010-182727 w/partial English translation.

(Continued)

*Primary Examiner* — Teresa M Arroyo
(74) *Attorney, Agent, or Firm* — Oblon, Spivak, McClelland, Maier & Neustadt, L.L.P.

(57) ABSTRACT

A semiconductor power module includes an active element and a passive element serving as semiconductor elements each having a first electrode on a front surface and a second electrode on a back surface thereof, a heat pipe having a first region defined as arrangement parts of the active element and the passive element on its one end side and electrically connected to one of the first and second electrodes of the active element and the passive element arranged in the first region, a cooling fin arranged in a second region defined on the other end side of the heat pipe, and a heat pipe provided to sandwich the active element, the passive element, and the cooling fin arranged on the heat pipe along with the heat pipe and electrically connected to the other of the first and second electrodes of the active element and passive element.

10 Claims, 9 Drawing Sheets

(56) References Cited

U.S. PATENT DOCUMENTS

| | | | |
|---|---|---|---|
| 2008/0002359 A1* | 1/2008 | Sauciuc | 361/689 |
| 2008/0224303 A1* | 9/2008 | Funakoshi et al. | 257/701 |
| 2008/0239663 A1* | 10/2008 | Yamamoto et al. | 361/691 |
| 2011/0241198 A1* | 10/2011 | Azuma | 257/696 |

FOREIGN PATENT DOCUMENTS

| | | | | |
|---|---|---|---|---|
| JP | 03-231446 | 10/1991 | | |
| JP | 04073791 A | * 3/1992 | | G09F 9/00 |
| JP | 06-053679 | 2/1994 | | |
| JP | 08-008398 | 1/1996 | | |
| JP | 11-40717 | 2/1999 | | |
| JP | 2003-338592 | 11/2003 | | |
| JP | 2005-123265 | 5/2005 | | |
| JP | 2006-134990 | 5/2006 | | |
| JP | 2007-310716 | 11/2007 | | |
| JP | 2008-28163 | 2/2008 | | |
| JP | 2009-88386 | 4/2009 | | |

OTHER PUBLICATIONS

First Office Action dated Nov. 5, 2013 in Chinese Patent Application No. 2011/10237469.3 (with partial English Translation).

* cited by examiner

F I G . 1
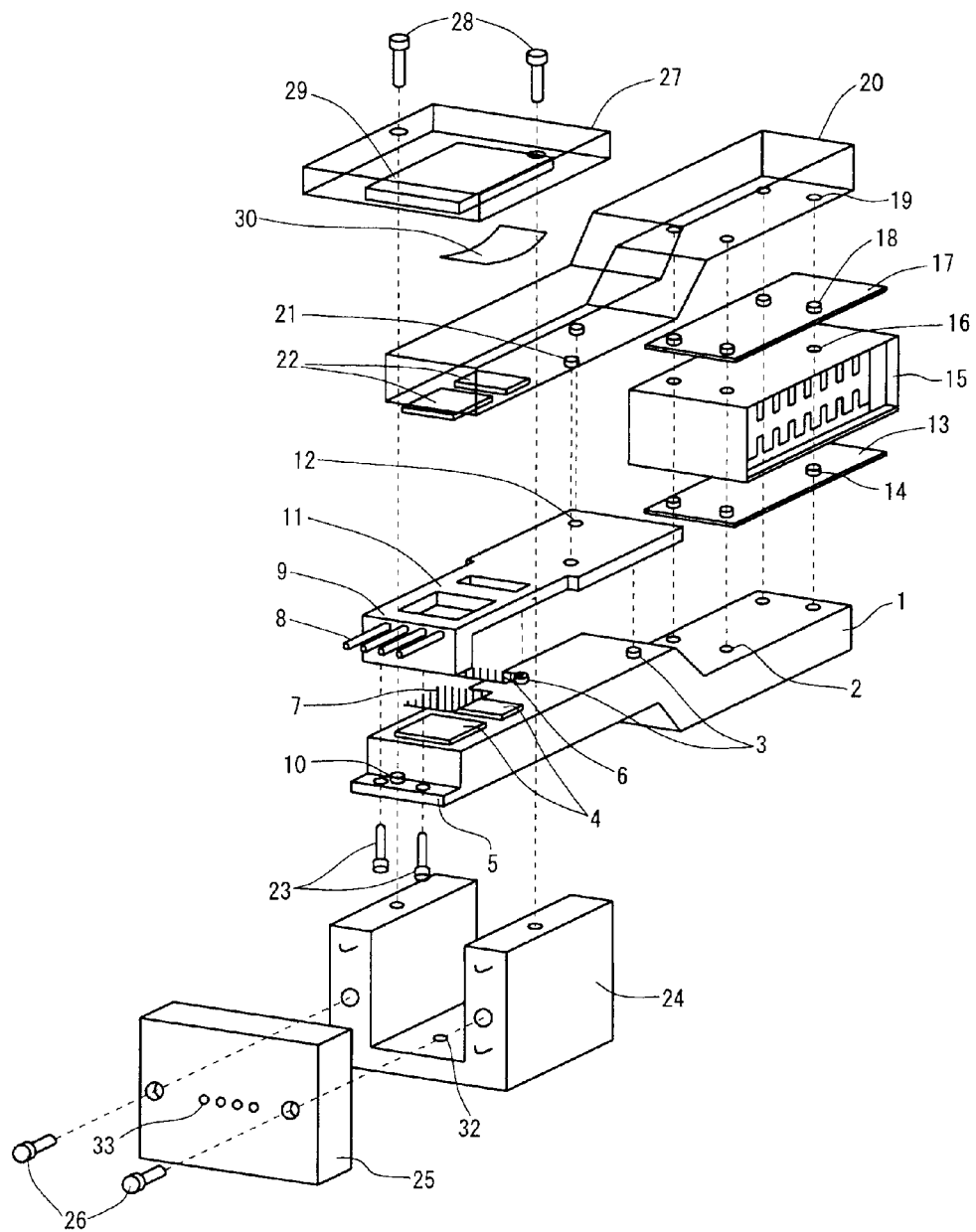

F I G . 3
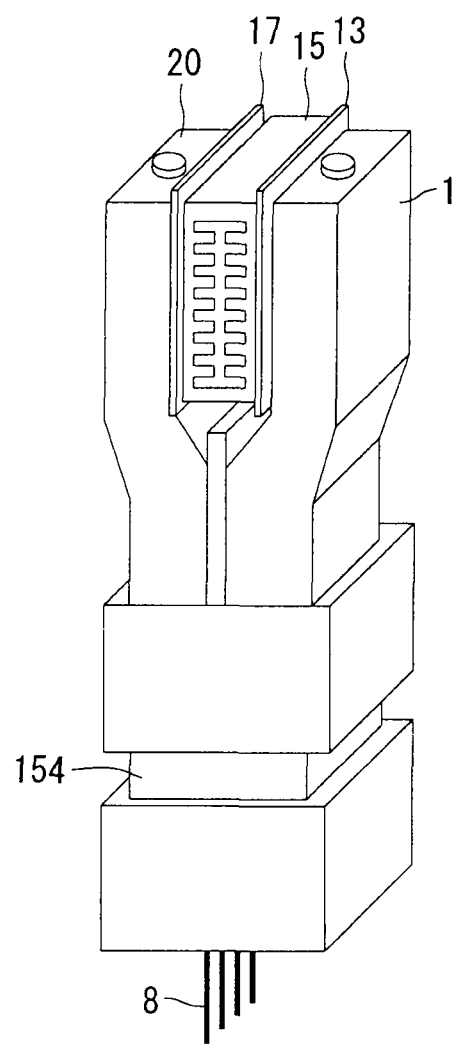

F I G . 6
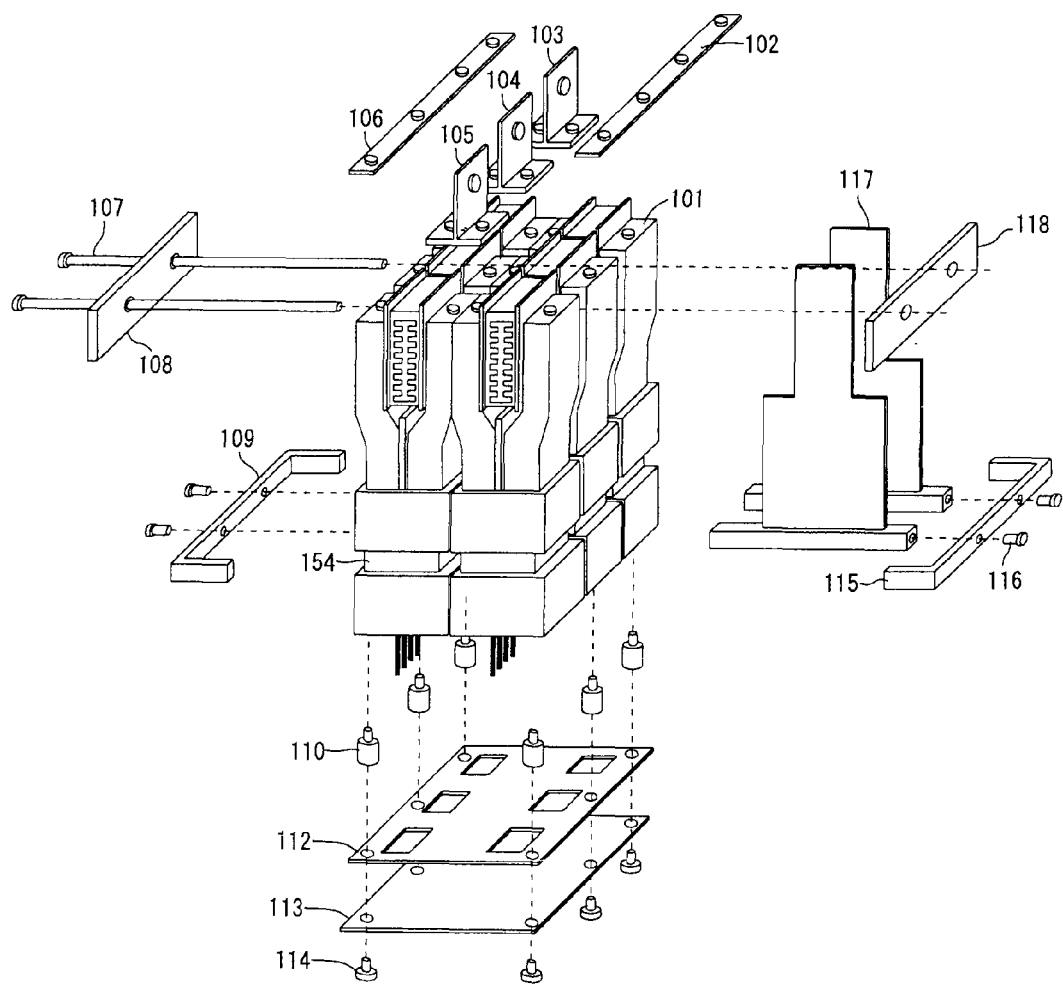

SEMICONDUCTOR POWER MODULE

BACKGROUND OF THE INVENTION

1. Field of the Invention

The present invention relates to a semiconductor power module and more particularly, to a heat releasing structure of a MOSFET (Metal-Oxide-Semiconductor Field-Effect Transistor), a bipolar transistor, an IGBT (Insulated Gate Bipolar Transistor), and the like which are used in power control devices.

2. Description of the Background Art

The conventional semiconductor power module is provided in such a manner that an active element (such as IGBT) and a passive element (FwDi: Free Wheel Diode) are connected through an aluminum wire, a relay terminal of a control signal is connected to the active element through the aluminum wire, an emitter electrode plate is connected to the passive element through the aluminum wire, an aluminum pattern is arranged under the active element and the passive element, a heat spreader is arranged under them with an insulating substrate interposed therebetween, and a cooling fin is also arranged under it. A collector electrode plate is connected to the aluminum pattern through the aluminum wire, and an external busbar is connected to each of the emitter electrode plate and the collector electrode plate.

Heat generated in the active element and the passive element is released by the cooling fin through the heat spreader.

Based on the above structure, Japanese Patent Application Laid-Open No. 2006-134990 discloses a structure in which a metal bar is connected to electrodes arranged on vertical both surfaces of a semiconductor element, to improve heat exchange efficiency of a heat generating part. In addition, it is described that the metal bar may be a thin-plate heat pipe.

However, in this structure, heat release is not sufficient to implement a high power, and it is difficult to implement sufficient heat releasing performance without increasing a size of a module itself.

SUMMARY OF THE INVENTION

It is an object of the present invention to provide a semiconductor power module having sufficient heat releasing performance without increasing a size of the module itself.

A semiconductor power module according to the present invention includes a semiconductor element having a first electrode on a front surface and a second electrode on a back surface thereof, a first heat pipe having a first region defined as an arrangement part of the semiconductor element on its one end side and electrically connected to one of the first and second electrodes of the semiconductor element arranged in the first region, a cooling fin arranged in a second region defined on the other end side of the first heat pipe, and a second heat pipe provided to sandwich the semiconductor element and the cooling fin arranged on the first heat pipe along with the first heat pipe and electrically connected to the other of the first and second electrodes of the semiconductor element.

The semiconductor power module according to the present invention can implement sufficient heat releasing performance with the heat pipe and the cooling fin without increasing a size of the module.

The semiconductor power module according to the present invention includes the semiconductor element having the first electrode on the front surface and the second electrode on the back surface thereof, the first heat pipe having the first region defined as the arrangement part of the semiconductor element on its one end side and electrically connected to one of the first and second electrode of the semiconductor element arranged in the first region, the cooling fin arranged in the second region defined on the other end side of the first heat pipe, and the second heat pipe provided to sandwich the semiconductor element and the cooling fin arranged on the first heat pipe along with the first heat pipe and electrically connected to the other of the first and second electrodes of the semiconductor element, so that the sufficient heat releasing performance can be implemented without increasing the size of the module itself.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an assembly diagram of a semiconductor power module according to a first embodiment;

FIG. 3 is a completion drawing of the semiconductor power module according to the first embodiment;

FIG. 6 is an assembly diagram of the semiconductor power module according to the third embodiment;

DESCRIPTION OF THE PREFERRED EMBODIMENTS

Figure 9:
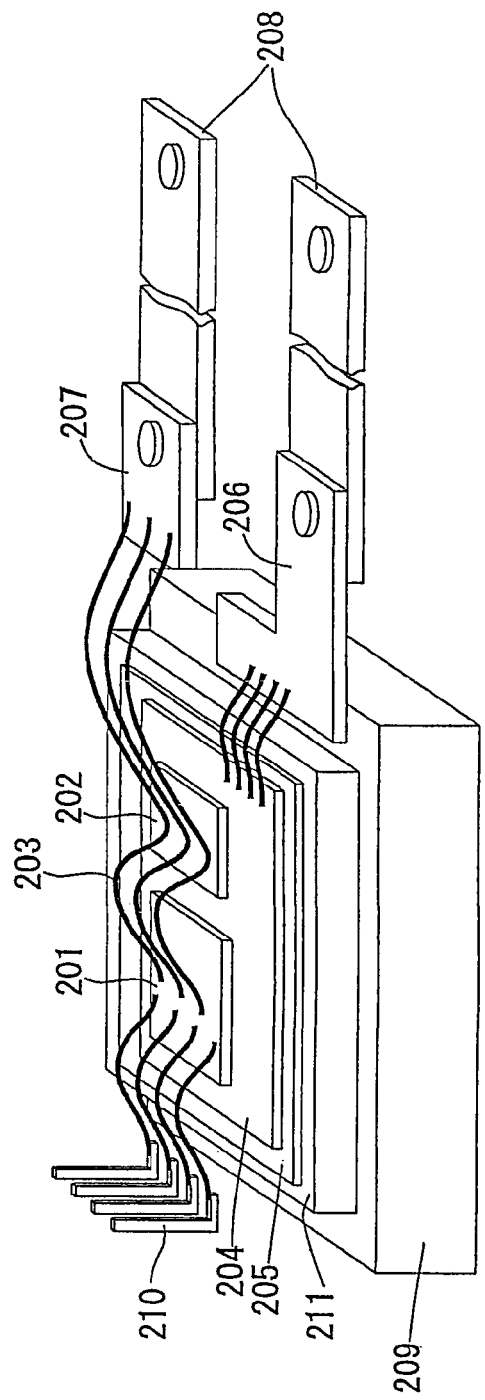
FIG. 9 is an outline view of a semiconductor power module according to a background technique.

As shown in an outline view in FIG. 9, a semiconductor power module according to a background technique of the present invention is provided such that an active element 201 (such as IGBT) and a passive element 202 (FwDi) are connected through an aluminum wire 203, a relay terminal 210 of a control signal is connected to the active element 201 through the aluminum wire 203, an emitter electrode plate 207 is connected to the passive element 202 through the aluminum wire 203, an aluminum pattern 204 is arranged under the active element 201 and the passive element 202, a heat spreader 211 is arranged under them with an insulating substrate 205 interposed therebetween, and a cooling fin 209 is also arranged under it. A collector electrode plate 206 is connected to the aluminum pattern 204 through the aluminum wire 203, and an external busbar 208 is connected to each of the emitter electrode plate 207 and the collector electrode plate 206.

In this structure, heat generated in the active element 201 and the passive element 202 is released by the cooling fin 209 through the heat spreader 211.

In addition, the Japanese Patent Application Laid-Open No. 2006-134990 also discloses a structure in which a semiconductor element is vertically sandwiched between metal plates.

However, heat release efficiency is not sufficient for a high-output semiconductor power module in these structures, and it is required to further improve heat release performance. The following embodiment shows a semiconductor power module further improved in heat release efficiency to satisfy the above request.

A. First Embodiment

<A-1. Configuration>

Figure 2:
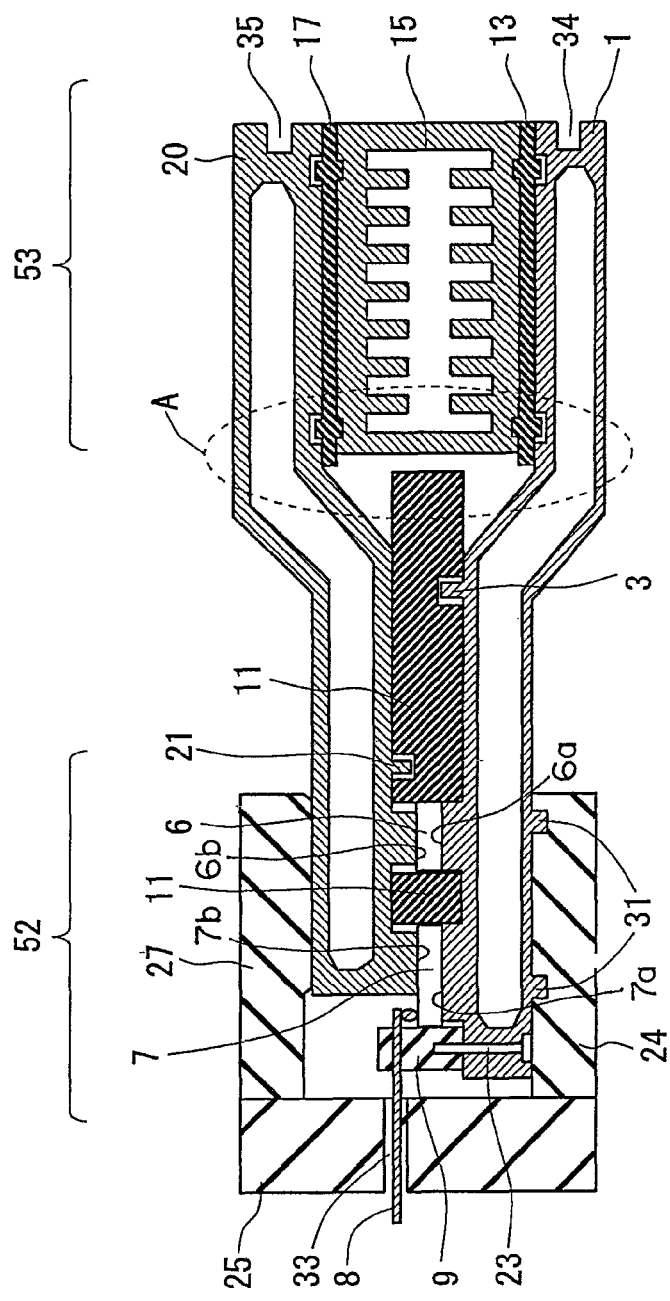
FIG. 2 is a cross-sectional view of the semiconductor power module according to the first embodiment after assembled.

FIG. 1 is an assembly diagram of a semiconductor power module (1 in 1 circuit module) according to the present invention, and FIG. 2 is a cross-sectional view after assembled. Hereinafter, a description will be made with reference to FIGS. 1 and 2.

As shown in FIGS. 1 and 2, the semiconductor power module is provided in such a manner that an active element 7 and a passive element 6 as heating elements are arranged so as to be each aligned with a plane projection 4 formed on a heat pipe 1 so as to have a height and an area required for insulation, and an insulating plate 11 is provided thereon so as not to overlap the active element 7 and the passive element 6, that is, provided around the active element 7 and the passive element 6. Here, each of the active element 7 and the passive element 6 serving as semiconductor elements has a first electrode 6a or 7a and a second electrode 6b or 7b on its front surface and back surface, respectively, and is electrically connected to the heat pipe 1 and a heat pipe 20 (which will be described below) through the first electrode and the second electrode. The insulating plate 11 is an insulating body such as a hard resin mold. Each of the plane projection 4 and a plane projection 22 (which will be described below) has a height so as to be able to absorb a difference in thickness between the active element 7 and the passive element 6 arranged in parallel, and the insulating plate 11 regulates the arrangement positions of the active element 7 and the passive element 6. Here, a region containing the position where the active element 7 and the passive element 6 are arranged on the heat pipe 1 is set as a first region.

The heat pipe 1 and the insulating plate 11 can be provided with a positioning projection 3 and a corresponding positioning hole 12, respectively, so that a positional relationship between them can be fixed. A relay terminal holder 9 is provided on the outer side of the insulating plate 11 on the side of the active element 7, and a relay terminal 8 is led to a control signal pad (not shown) of the active element 7 through the relay terminal holder 9, and directly connected thereto. While the relay terminal holder 9 is fixed to the heat pipe 1 or the heat pipe 20 through the insulating plate 11, the relay terminal holder 9 and the insulating plate 11 may be provided separately, and in this case, positioning of the element and connection of the relay terminal 8 can be performed in separate steps, so that an assembly property can be improved.

The relay terminal 8 roundly projects in a part of contact with the control signal pad (not shown) of the active element 7, thereby preventing the part of contact with the active element 7 from being deteriorated. In addition, the relay terminal 8 is made of elastic conductive metal, and a contact point height of the relay terminal 8 with the active element 7 is set so as to be a little lower than an upper surface of the active element 7, whereby the contact can be stably provided due to the elasticity of the relay terminal 8.

In addition, the relay terminal 8 and the active element 7 may be connected with wire bonding or soldering. In a case where the heat pipe 1 and the heat pipe 20 are overheated at the time of soldering of the active element 7, the heat pipe 1 and the heat pipe 20 can be prevented from being overheated by encapsulating a cooling medium (which will be described below) in the heat pipe 1 and the heat pipe 20 after assembled.

In the drawing, a fixed projection 5 is provided on a side surface of the heat pipe 1, and positioning between the heat pipe 1 and the insulating plate 11 is performed with a positioning projection 10 provided in the fixed projection 5, and they are fixed by inserting a screw 23 to a hole provided similarly.

An extended part of the heat pipe 1 on the side of the passive element 6 is bent downward, and an insulating plate 13 is provided on a bent region. The bent region of the heat pipe 1 and the insulating plate 13 can be provided with a positioning hole 2 and a corresponding positioning projection 14, respectively, whereby a positional relationship between them can be fixed. A cooling fin 15 is provided on the insulating plate 13, that is, in a second region provided in the heat pipe 1 on the side opposite to the first region, and the cooling fin 15 and the insulating plate 13 can be provided with a positioning hole 16 and the corresponding positioning projection 14, respectively, whereby a positional relationship between them is fixed.

In the drawing, an insulating plate 17 is similarly positioned on the cooling fin 15 with the positioning hole 16 and a positioning projection 18. In addition, the heat pipe 20 is bent so as to be mirror symmetrical to the heat pipe 1 and a positional relationship with the insulating plate 17 is fixed with a positioning hole 19 and the positioning projection 18. Thus, the cooling fin 15 is sandwiched between the heat pipe 1 and the heat pipe 20.

The heat pipe 20 is provided with a plane projection 22 formed to have a height and an area required for insulation and arranged over the active element 7 and the passive element 6, and the heat pipe 20 is positioned over them with a positioning projection 21 and the positioning hole 12.

In addition, a case 24 is provided so as to firmly cover the region of the active element 7 and the passive element 6. The case 24 is a hard insulation body made of a material such as a resin, and a positioning hole 32 provided in the case 24 and a positioning projection 31 provided in the heat pipe 1 so as to correspond to it are fitted to each other, and a press spring 30 to stabilize the fastening due to its elasticity, a plane projection 29, and a lid 27 serving as a hard insulator made of a material such as a resin are sequentially put thereon, and fixed by a screw 28. In addition, a lid 25 serving as a hard insulator made of a material such as a resin is set on the side by inserting the relay terminal 8 to a through hole 33, and fixed by a screw 26. The active element 7, the passive element 6, the heat pipe 1, the heat pipe 20, and the case 24 can be assembled without using a conductive bonding material. As shown in FIG. 2, a region covered with the case 24 serves as a heat receiving part 52, and a region covering the cooling fin 15 serves as a heat releasing part 53.

Each of the heat pipe 1 and the heat pipe 20 is made of a conductive material, and has a plane surface. They are hollow inside and a cooling medium is sealed therein. In addition, in a case where the semiconductor power module is a type of low output and low heat generation, one or both of the heat pipe 1 and the heat pipe 20 may be replaced with a usual conductor having no hollow and no cooling medium. The cooling medium is vaporized in the heat receiving part 52, and liquefied in the heat releasing part 53 to perform heat exchange. The heat pipe 1 and the heat pipe 20 have a vaporization heat cooling structure.

In addition, the heat pipe 1 and the heat pipe 20 are formed into a stepped shape in which they are bent in a direction from which a distance between the heat pipe 1 and the heat pipe 20 increases (direction parting from each other), in the vicinity of the heat releasing part 53 to ensure a creepage distance for insulation in a space (shown by A in FIG. 2) between the insulating plate 11 and the cooling fin 15, and to absorb the thicknesses of the cooling fin 15, the insulating plate 13, and the insulating plate 17. Consequently, the second region on the other end opposite to the first region is thicker than the first region having the active element 7 and the passive element 6. Thus, in this structure, an insulation property can be ensured while preventing the module from increasing its size. In addition, only one of the heat pipe 1 and the heat pipe 20 may have the bent shape.

A thickness of the insulating plate 11 is set so as to be able to ensure a creepage distance for insulation at a junction part between the active element 7 and the passive element 6, and coincide with a height of a gap of a junction part between the active element 7 and the passive element 6 provided after the insulating plate 11 has been sandwiched between the heat pipe 1 and the heat pipe 20. In addition, the heat pipe 1 and the heat pipe 20 have a screw hole 34 and a screw hole 35 at their ends, respectively, to be connected to an external wiring.

Each of the passive element 6 and the active element 7 is previously arranged on the plane projection 4 of the heat pipe 1, and the insulating plate 11 is put thereon. Thus, even when the passive element 6 and the active element 7 are not soldered, the positioning projection 3 and the positioning hole 12 can prevent their horizontal displacement.

The insulating plate 13 and the insulating plate 17 are thin plates made of a material such as ceramics having high heat conductivity, have the positioning projection 14 and the positioning projection 18 formed by molding or bonding on vertical both surfaces, respectively, and adhere to the heat pipe 1, the heat pipe 20, and the cooling fin 15 with heat-conducting grease (not shown) provided therebetween.

The cooling fin 15 is made of a material such as metal having high heat conductivity, and has fin-shaped projections in an inner cooling medium passage, so that heat releasing effect can increase. The cooling fin 15 has a fitting structure in each opening part, and can be connected to the same adjacent fin structure. In addition, the fitting structure is configured to prevent the liquid cooling medium from leaking by use of packing or O-ring.

The insulating plate 11, the insulating plate 13, the insulating plate 17, and cooling fin 15 sandwiched between the heat pipe 1 and the heat pipe 20 are all positioned with respect to each other with the positioning projection 3, the positioning projection 14, the positioning projection 18, the positioning projection 21, the positioning hole 2, the positioning hole 12, the positioning hole 16, and the positioning hole 19, so that their displacement can be prevented.

The whole structure can be assembled without using the conductive bonding material such as soldering, which can cut manufacturing cost and prevent reliability degradation caused by a soldering crack.

Meanwhile, in a case where the passive element 6 and the active element 7 are connected to the heat pipe 1 and heat pipe 20 with soldering, and the relay terminal 8 is connected to the active element 7 with soldering, they can be integrated with resin molding instead of the case 24, the lid 25, and lid 27.

FIG. 3 is a completion drawing of the semiconductor power module (1 in 1 circuit module) according to the present invention. The case 24 to cover the heat releasing part 53 is provided with a fastener groove 154 for a module fastener fitting 109 and a module fastener fitting 115 which will be described below (refer to FIG. 6) to fasten the cases to each other. The fastener groove 154 is provided in the surfaces of the case 24 and the lid 27 to cover the heat releasing part 53, so that the modules are fastened to each other in no particular order.

<A-2. Effect>

According to the first embodiment of the present invention, the semiconductor power module includes the active element 7 and the passive element 6 serving as the semiconductor elements each having the first electrode on its front surface and the second electrode on its back surface, the heat pipe 1 as a first heat pipe having the first region defined as the arrangement part of the active element 7 and the passive element 6 on its one end side and electrically connected to the one of the first and second electrodes of the active element 7 and the passive element 6 arranged in the first region, the cooling fin 15 arranged in the second region defined on the other end side of the heat pipe 1, and the heat pipe 20 as a second heat pipe provided to sandwich the active element 7, the passive element 6, and the cooling fin 15 arranged on the heat pipe 1 along with the heat pipe 1 and electrically connected to the other one of the first and second electrodes of the active element 7 and the passive element 6, so that sufficient heat releasing performance can be implemented without increasing the size of the module itself.

In addition, according to the first embodiment of the present invention, the semiconductor power module further includes the insulating plate 11 serving as a first insulating plate arranged around the active element 7 and the passive element 6 serving as the semiconductor elements in the first region to regulate the arrangement positions of the active element 7 and the passive element 6, and the insulating plate 11 is positioned with respect to the heat pipe 1 and the heat pipe 20 serving as the first and second heat pipes, so that displacement is prevented from being generated and reliability is improved. In addition, even when the insulating plate 11 positioned as described above is not provided, sufficient heat releasing performance can be implemented without increasing the size of the module itself.

In addition, according to the first embodiment of the present invention, in the semiconductor power module, the insulating plate 11 serving as the first insulating plate and the heat pipe 1 and heat pipe 20 serving as the first and second heat pipes further include the positioning projection 3, the positioning hole 12, and the positioning projection 21 serving as first fitting parts corresponding to each other, so that displacement is prevented from being generated, and reliability is improved. In addition, the first fitting part may not be provided as long as the positional relationship is fixed among the heat pipe 1, the heat pipe 20, and the insulating plate 11, and even though it is not fixed, sufficient heat releasing performance can be implemented without increasing the size of the module itself.

In addition, according to the first embodiment of the present invention, the semiconductor power module further includes the insulating plate 13 and the insulating plate 17 serving as a second insulating plate and a third insulating plate, respectively arranged between the cooling fin 15, and the heat pipe 1 and the heat pipe 20 serving as the first and second heat pipes, in the second region to regulate the arrangement position of the cooling fin 15, and the insulating plate 13 and the insulating plate 17 are positioned with respect to the heat pipe 1 and the heat pipe 20, respectively, so that displacement is prevented from being generated and reliability is improved. In addition, even when the insulating plate 13 and the insulating plate 17 positioned in this way are not provided, sufficient heat releasing performance can be implemented without increasing the size of the module itself.

In addition, according to the first embodiment of the present invention, in the semiconductor power module, the insulating plate 13 and the insulating plate 17 serving as the second and third insulating plates and the heat pipe 1 and heat pipe 20 serving as the first and second heat pipes further include the positioning hole 2, the positioning projection 14, the positioning hole 16, the positioning projection 18, and the positioning hole 19 serving as second fitting parts corresponding to each other, so that displacement is prevented from being generated, and reliability is improved. In addition, the second fitting part may not be provided as long as the positional relationship is fixed among the heat pipe 1, the heat pipe 20, the insulating plate 13, and the insulating plate 17, and even though it is not fixed, sufficient heat releasing performance can be implemented without increasing the size of the module itself.

According to the first embodiment of the present invention, the semiconductor power module further includes the relay terminal holder 9 to lead the relay terminal 8 to be connected to the active element 7 and the passive element 6 serving as the semiconductor elements, and the relay terminal holder 9 is fixed to the heat pipe 1 or the heat pipe 20 serving as the first or the second heat pipes on the outer end side of the first region, so that the relay terminal 8 is stably connected to the active element 7 through the relay terminal holder 9, and reliability of the module is improved. In addition, even when the relay terminal holder 9 to lead the relay terminal 8 is not provided, sufficient heat releasing performance can be implemented without increasing the size of the module itself.

In addition, according to the first embodiment of the present invention, in the semiconductor power module, in the case where the insulating plate 11 is provided as the first insulating plate arranged around the active element 7 and the passive element 6 serving as the semiconductor elements in the first region to regulate the arrangement position of the active element 7 and the passive element 6, the relay terminal holder 9 is integrally formed with the insulating plate 11, so that the relay terminal 8 is stably connected to the active element 7 through the relay terminal holder 9, and reliability of the module is improved. In addition, even when the relay terminal holder 9 is not integrally provided with the insulating plate 11, sufficient heat releasing performance can be implemented without increasing the size of the module itself.

In addition, according to the first embodiment of the present invention, in the semiconductor power module, each of the heat pipe 1 and the heat pipe 20 serving as the first and second heat pipes has the cooling medium in the hollow provided inside it, so that when the heat pipe 1 and the heat pipe 20 are heated in the case where the relay terminal 8 and the active element 7 are connected with wire bonding or soldering, the heat pipe 1 and the heat pipe 20 are prevented from being overheated by the cooling medium sealed in the heat pipe 1 and the heat pipe 20 after completion of the assembly. In addition, even when the hollow to contain the cooling medium is not provided in the heat pipe 1 and the heat pipe 20, sufficient heat releasing performance can be implemented without increasing the size of the module itself.

In addition, according to the first embodiment of the present invention, the semiconductor power module further includes the case 24 arranged in the first region to cover the active element 7 and the passive element 6 serving as the semiconductor elements and the heat pipe 1 and the heat pipe 20 serving as the first and second heat pipes, so that the active element 7, the passive element 6, the heat pipe 1, the heat pipe 20, and the case 24 can be assembled without using the conductive bonding material, and reliability can be prevented from being lowered due to a soldering crack. In addition, even when the case 24 is not provided, sufficient heat releasing performance can be implemented without increasing the size of the module itself.

In addition, according to the first embodiment of the present invention, in the semiconductor power module, the thickness of the second region is larger than the thickness of the first region, and at least one of the heat pipe 1 and the heat pipe 20 serving as the first and second heat pipes has a stepped shape having the slanted surface ranging from the first region to the second region, so that insularity can be ensured, preventing the size of the module from increasing.

B. Second Embodiment

<B-1. Configuration>

Figure 4:
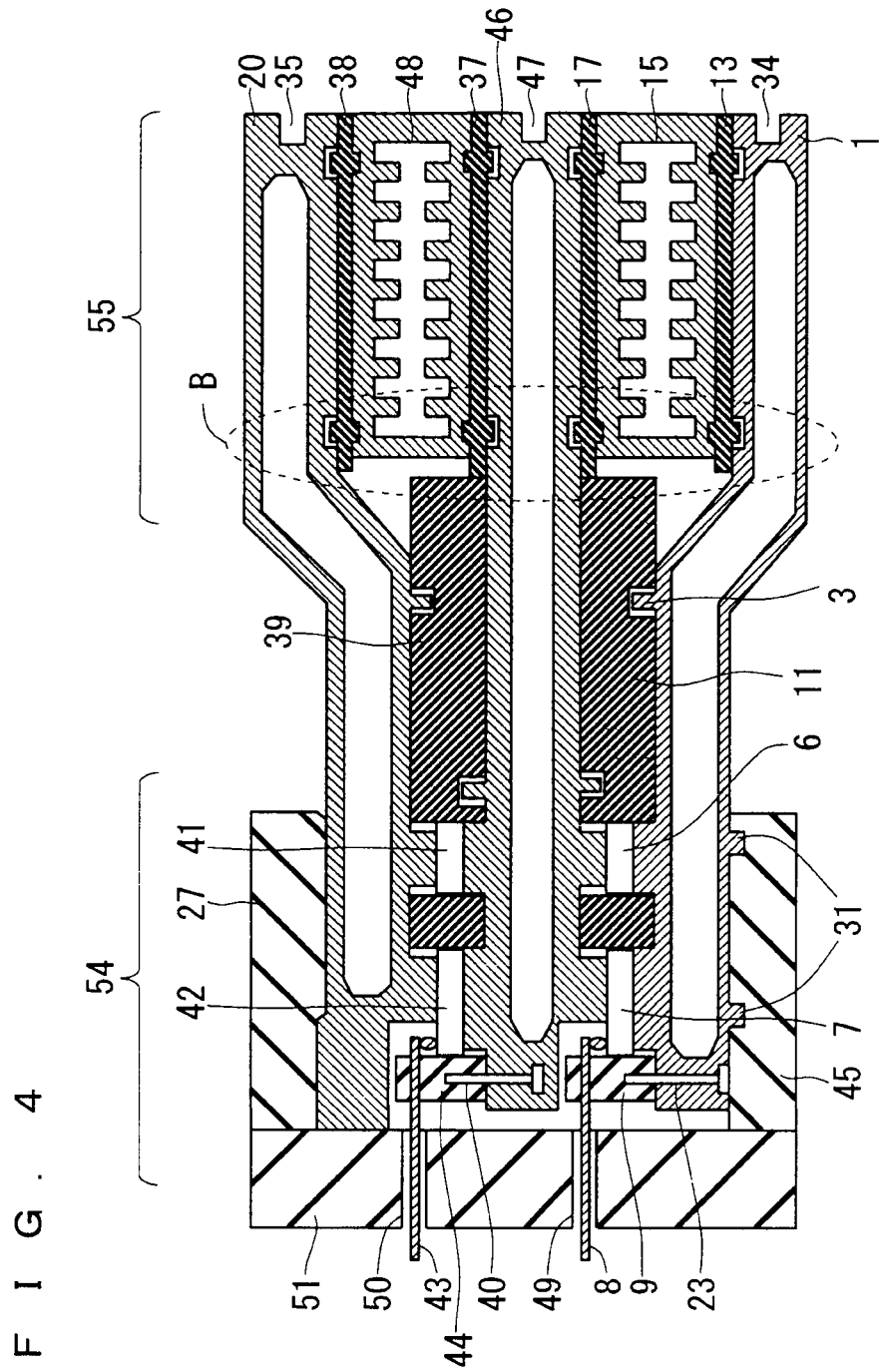
FIG. 4 is a cross-sectional view of a semiconductor power module according to a second embodiment after assembled.

FIG. 4 is a cross-sectional view of a semiconductor power module (2 in 1 circuit module) according to the present invention after assembled. A detailed description is not made of the same configuration as the first embodiment.

A heat pipe 46 is made of a conductive material and has a plane surface. An inside of it is hollow and a cooling medium is sealed therein. In addition, in a case where the semiconductor power module is a type of low output and low heat generation, one or both of heat pipe 1 and the heat pipe 20 may be replaced with a usual conductor having no hollow and no cooling medium. The cooling medium is vaporized in a heat receiving part 54, and liquefied in a heat releasing part 55 to perform heat exchange. The heat pipe 46 has a vaporization heat cooling structure.

The heat pipe 46 is provided with a plane projection formed to have a height and an area required for insulation and arranged over an active element 7, and a passive element 6, and an active element 42 and a passive element 41 serving as other semiconductor elements, and the heat pipe 46 is positioned over them with a positioning projection and a positioning hole. The height of the plane projection can absorb a difference in thickness among the active element 7, the active element 42, the passive element 6, and the passive element 41 provided parallel to each other.

While the heat pipe 46 serving as a third heat pipe is not bent, each of the heat pipe 1 and the heat pipe 20 has a stepped shape bent in a direction from which a distance from the heat pipe 46 increases (direction parting from each other), in the vicinity of a cooling fin to ensure a creepage distance for insulation in a space (shown by B in FIG. 4) between an insulating plate 11 and an insulating plate 39, and a cooling fin 15 and a cooling fin 48, and to absorb thicknesses of the cooling fin 15, the cooling fin 48, an insulating plate 13, an insulating plate 17, an insulating plate 37, and an insulating plate 38. Thus, in this structure, insularity can be ensured, keeping a size of the module. In addition, only one of the heat pipe 1 and the heat pipe 20 may have the bent shape.

In addition, the heat pipe 1, the heat pipe 20, and the heat pipe 46 have a screw hole 34, a screw hole 47, and a screw hole 35 to be connected to an external wiring, respectively.

The passive element 6, the active element 7, the insulating plate 11, and the cooling fin 15 sandwiched by the insulating plate 13 and the insulating plate 17 are sandwiched between the heat pipe 1 and the heat pipe 46 under the condition that they are positioned with the positioning holes and the positioning projections, respectively.

In addition, the active element 42, the passive element 41, the insulating plate 39, and the cooling fin 48 sandwiched by the insulating plate 37 and the insulating plate 38 are sandwiched between the heat pipe 46 and the heat pipe 20 under the condition that they are positioned with the positioning holes and the positioning projections, respectively. Thus, the module has a 2 in 1 circuit structure.

The insulating plate 39 serving as an insulator such as a hard resin mold is provided with a relay terminal holder 44 on the side of the active element 42 similar to the insulating plate 11, and a relay terminal 43 is directly connected to a control signal pad (not shown) of the active element 42 through the relay terminal holder 44. The relay terminal holder 44 and the insulating plate 39 may be provided separately, and in this case, positioning of the element and connection of the relay terminal can be performed in separate steps, so that an assembly property can be improved.

The relay terminal 43 roundly projects in a part of contact with the control signal pad of the active element 42, thereby preventing the part of contact with the active element 42 from being deteriorated. In addition, the relay terminal 43 is made of elastic conductive metal, and a contact point height of the relay terminal 43 with the active element 42 is set so as to be a little lower than an upper surface of the active element 42, whereby the contact can be stably provided due to the elasticity of the relay terminal 43. In addition, the relay terminal 43 and the active element 42 may be connected with wire bonding or soldering.

A case 45 is a hard insulator made of a material such as a resin, and positioned with respect to the heat pipe 1 with a positioning hole fitted to a positioning projection 31 of the heat pipe 20. In addition, an opening width of the case 45 is set so as to prevent the heat receiving part 54 (FIG. 4) inserting to the case 45 from shaking in the case 45, so that the heat receiving part 54 is not displaced after inserted to the case 45.

A lid 51 is a hard insulator made of a material such as a resin and screwed into the case 45 after a relay terminal 8 and the relay terminal 43 have been inserted into a through hole 49 and a through hole 50, respectively.

A lid 27 is a hard insulator made of a material such as a resin and mounted on the case 45 from the side of the heat pipe 20 with a unit incorporated in the case 45. The heat pipe 20 and the lid 27 can be further fastened stably by inserting an elastic member such as a press spring (not shown) therebetween.

The whole structure can be assembled without using a conductive bonding material such as soldering, which can cut manufacturing cost and prevent reliability degradation caused by a soldering crack.

Meanwhile, in a case where the passive element 6, the passive element 41, the active element 7, and the active element 42 are connected to the heat pipe 1, the heat pipe 20, and the heat pipe 46 with soldering, and the relay terminal 8 and the relay terminal 43 are connected to the active element 7, and the active element 42 with bonding wire or soldering, respectively, they can be integrated with resin molding instead of the case 45, the lid 27, and lid 51.

Figure 5:
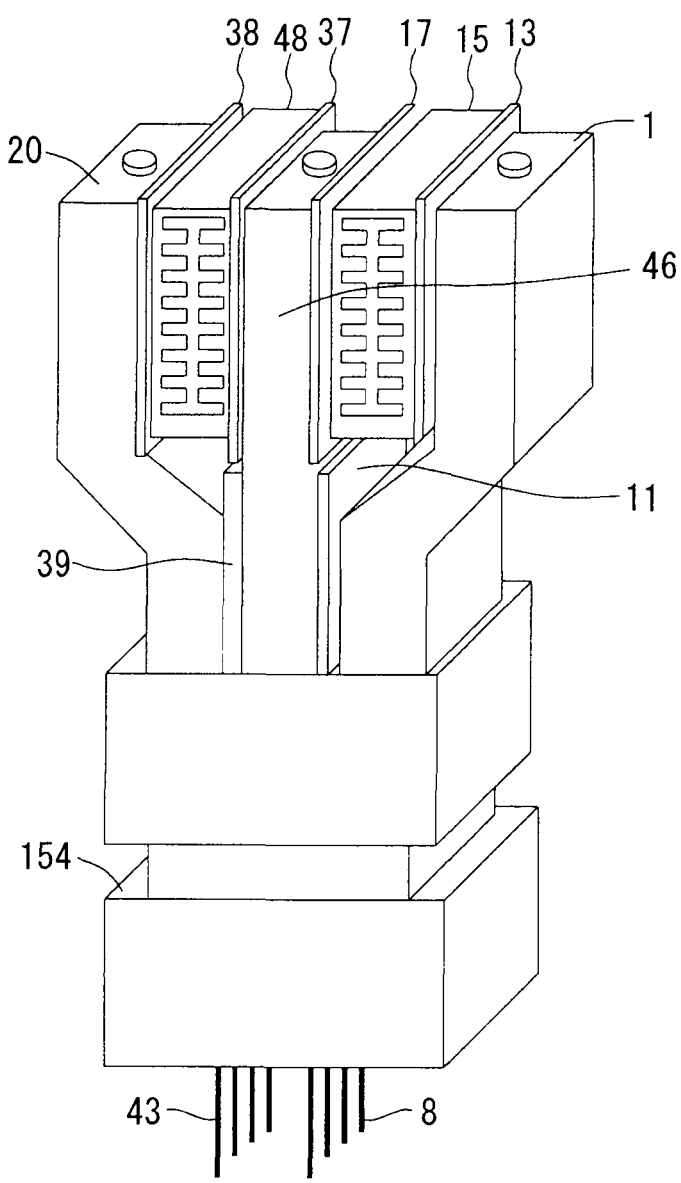
FIG. 5 is a completion drawing of a semiconductor power module according to the second embodiment.

FIG. 5 is a completion drawing of the semiconductor power module (2 in 1 circuit module) according to the present invention. The case 45 to cover the heat releasing part 55 is provided with a fastener groove 154 for a module fastener fitting 109 and a module fastener fitting 115 which will be described below (refer to FIG. 6) to fasten the cases to each other. The fastener groove 154 is provided in the surfaces of the case 45 and the lid 27 to cover the heat releasing part 55, so that the modules are fastened to each other in no particular order.

<B-2. Effect>

According to the second embodiment of the present invention, the semiconductor power module further includes the active element 42 and the passive element 41 serving as the another semiconductor elements arranged on the heat pipe 20 serving as the second heat pipe, the another cooling fin 48, and the heat pipe 46 serving as the third heat pipe to sandwich the another active element 42 and passive element 41, and the another cooling fin 48 along with the heat pipe 20, whereby the 2 in 1 circuit module can be formed by fastening the two unit modules into one. In addition, even when the active element 42 and the passive element 41 are not additionally provided, similar to the structure as shown in the first embodiment, sufficient heat releasing performance can be implemented without increasing the size of the module itself.

C. Third Embodiment

<C-1. Configuration>

FIG. 6 is an assembly diagram of a semiconductor power module (6 in 1 inverter) according to the present invention. The 6 in 1 inverter has a circuit configuration provided by connecting the six 1 in 1 circuit modules shown in the first embodiment.

A case to cover a heat releasing part of each 1 in 1 module (unit module 101) is provided with a fastener groove 154 to which a module fastener fitting 109 and a module fastener fitting 115 to fasten the cases to each other are inserted. The fastener groove 154 is provided on a side surface of the heat releasing part so as to be fastened in four directions.

As shown in the diagram, a W-phase electrode connecting busbar 103, a V-phase electrode connecting busbar 104, a U-phase electrode connecting busbar 105 are arranged to connect the electrodes on the P side and the N side with respect to a W phase, a V phase, and a U phase. The electrodes on the side of a P power supply are connected by a P-side connecting busbar 102, and the electrodes on the side of an N power supply are connected by an N-side connecting busbar 106 to each module in the invertor.

The module fastener fitting 109, and the module fastener fitting 115 fasten the unit modules 101 by screwing a screw 116 into an inter-phase insulating plate 117 inserted to the unit modules 101.

A cooling fin part is fastened by arranging a cooling part fastener plate 108 and a cooling part fastener plate 118 serving as non-conductors on the P side and the N side, respectively and inserting a cooling part fastener screw 107 which is a non-conductor or has been subjected to an insulating process.

A shield plate 112 and a control substrate 113 are fixed by a spacer 110 and a screw 114 mounted on a mold part lower surface.

Figure 7:
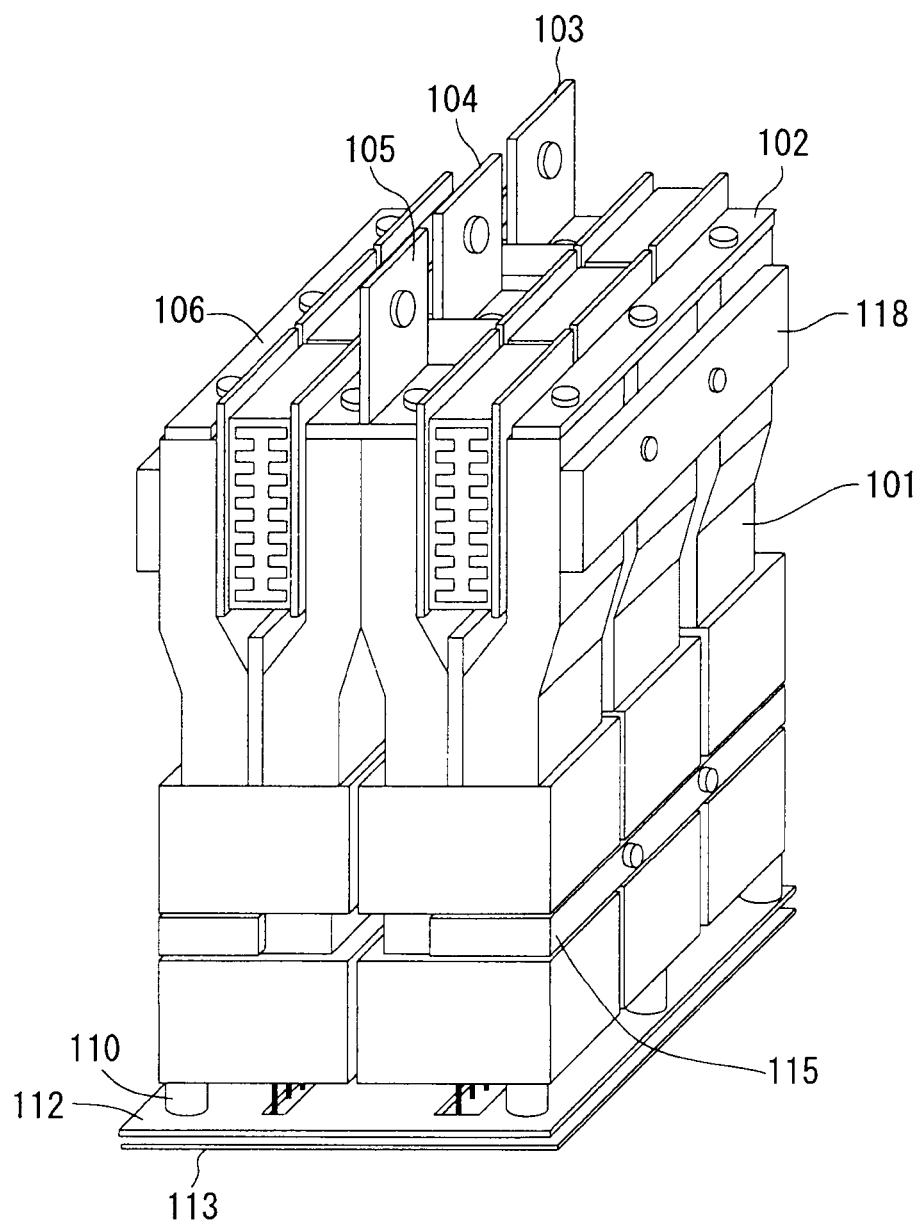
FIG. 7 is a completion drawing of the semiconductor power module according to the third embodiment.
Figure 8:
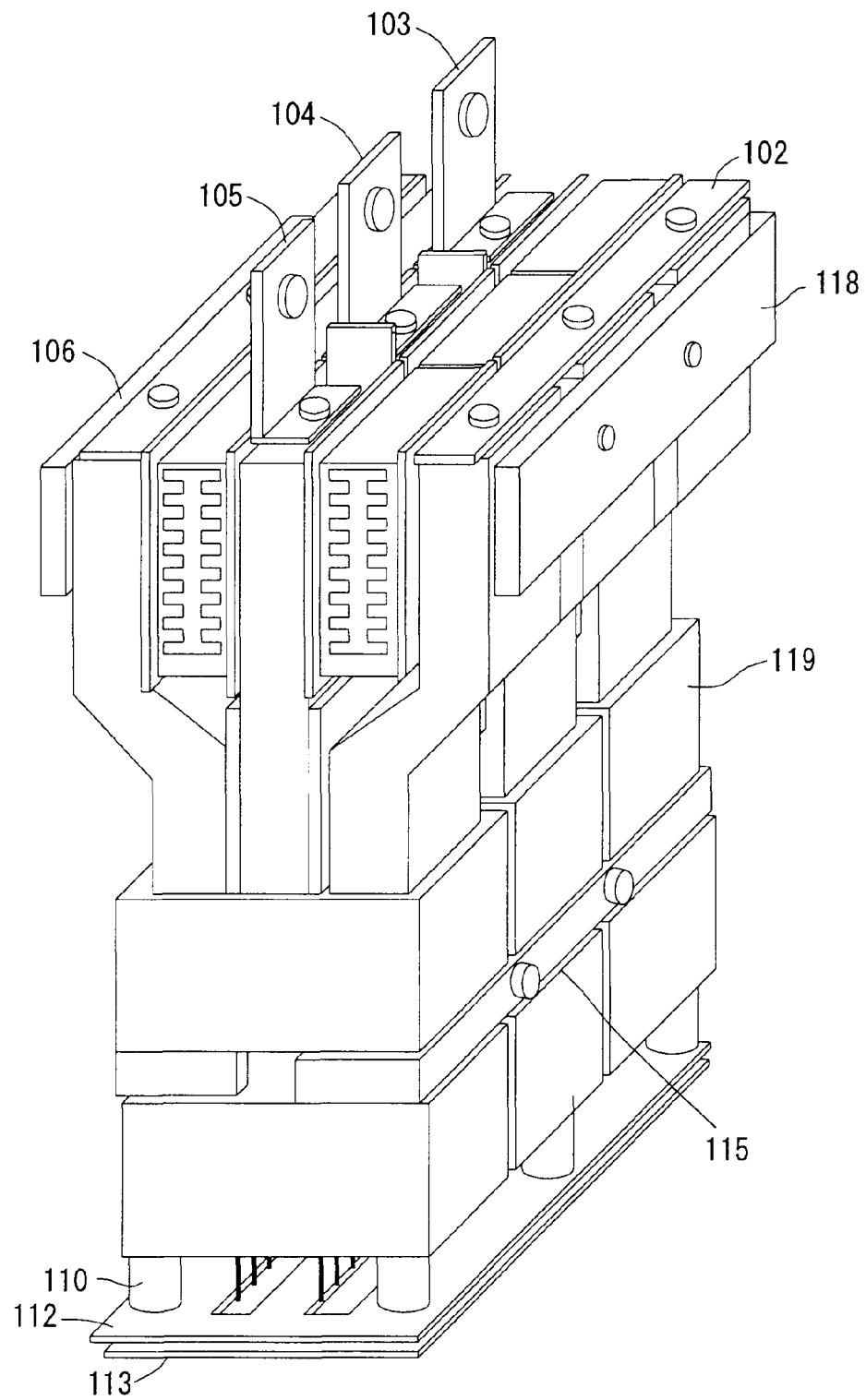
FIG. 8 is a completion drawing of the semiconductor power module according to the third embodiment.

FIG. 7 is a completion drawing of the 6 in 1 invertor module formed by connecting the six 1 in 1 modules shown in the first embodiment as the unit modules 101. Meanwhile, FIG. 8 is a completion drawing of a 6 in 1 invertor module formed by connecting the six 2 in 1 modules shown in the second embodiment as unit modules 119.

Thus, the cooling and wiring structures of the semiconductor power part are integrated, and the small-size connectable module which can cool both sides of the element is combined by the above method, whereby the small-size and high-output invertor module can be provided.

<C-2. Effect>

According to the third embodiment of the present invention, the semiconductor power module includes the plurality of semiconductor power modules, and the fasteners such as the module fastener fitting 109, the module fastener fitting 115, and the screw 116 to integrally fasten the plurality of semiconductor power modules, whereby the 6 in 1 circuit module (refer to FIG. 6) can be formed by fastening the six unit modules into one. In addition, even when the plurality of semiconductor modules are not integrally fastened, sufficient heat releasing performance can be implemented without increasing the size of the module itself.

While the material of each component and the condition of the implementation are described in the embodiments of the present invention, these are just examples and the present invention is not limited to the examples.

While the invention has been shown and described in detail, the foregoing description is in all aspects illustrative and not restrictive. It is therefore understood that numerous modifications and variations can be devised without departing from the scope of the invention.

What is claimed is:

1. A semiconductor power module comprising:
a semiconductor element having a first electrode on a front surface and a second electrode on a back surface thereof;
a first heat pipe having a first region at one end of the first heat pipe, the one end of the first heat pipe being electrically connected to one of the first and second electrodes of the semiconductor element, the first heat pipe further having a second region at an other end thereof;
a second heat pipe having a first region at one end of the second heat pipe, the one end of the second heat pipe being electrically connected to the other of the first and second electrodes of the semiconductor element, the second heat pipe further having a second region at an other end thereof, wherein the first region of the first heat pipe and the first region of the second heat pipe together sandwich the semiconductor element therebetween;
a cooling fin sandwiched between the second region of the first heat pipe and the second region of the second heat pipe; and
a first insulating plate surrounding the semiconductor element in the first regions to regulate an arrangement position of the semiconductor element,
wherein at least one of the first and second heat pipes has a positioning projection for providing positioning with respect to the first insulating plate, and
the first insulating plate has a positioning hole for housing therein the positioning projection of the at least one of the first and second heat pipes.

2. The semiconductor power module according to claim 1, further comprising second and third insulating plates respectively arranged between the cooling fin and the first heat pipe and between the cooling fin and the second heat pipe in the second regions to regulate an arrangement position of the cooling fin, wherein the second and third insulating plates each have a positioning part that positions the second and third insulating plate with respect to the first or second heat pipe.

3. The semiconductor power module according to claim 2, wherein the second and third insulating plates each have a second fitting part, and the first and second heat pipes each have a part that fits with the second fitting part of the respective second and third insulating plates.

4. The semiconductor power module according to claim 1, further comprising a relay terminal holder fixed to the first or second heat pipe on an outer end side of the first region of the respective heat pipe.

5. The semiconductor power module according to claim 4, wherein the relay terminal holder is integrally formed with the first insulating plate.

6. The semiconductor power module according to 1, wherein each of the first and second heat pipes is provided with a cooling medium in a hollow provided inside thereof.

7. The semiconductor power module according to claim 1, further comprising a case arranged in the first region of the first and second heat pipes to cover the semiconductor element and the first and second heat pipes, and
wherein the semiconductor element, the first and second heat pipes, and the case are assembled without using a conductive bonding material.

8. The semiconductor power module according to claim 1, further comprising:
another semiconductor element and another cooling fin arranged on the second heat pipe; and
a third heat pipe which, together with the second heat pipe, sandwiches the another semiconductor element and the another cooling fin.

9. The semiconductor power module according to claim 1, wherein
a thickness of the second region of each of the respective first and second heat pipes is larger than a thickness of the first region, and
at least one of the first and second heat pipes is formed into a stepped shape having a slanted surface ranging from the first region to the second region.

10. A semiconductor power module assembly comprising:
a first semiconductor power module and a second semiconductor power module, each of the first and second semiconductor power modules, respectively, including:
a semiconductor element having a first electrode on a front surface and a second electrode on a back surface thereof;
a first heat pipe having a first region at one end of the first heat pipe, the one end of the first heat pipe being electrically connected to one of the first and second electrodes of the semiconductor element, the first heat pipe further having a second region at an other end thereof;
a second heat pipe having a first region at one end of the second heat pipe, the one end of the second heat pipe being electrically connected to the other of the first and second electrodes of the semiconductor element, the second heat pipe further having a second region at an other end thereof, wherein the first region of the first heat pipe and the first region of the second heat pipe together sandwich the semiconductor element therebetween;
a cooling fin sandwiched between the second region of the first heat pipe and the second region of the second heat pipe; and
an insulating plate surrounding the semiconductor element in the first regions to regulate an arrangement position of the semiconductor element, wherein at least one of the first and second heat pipes has a positioning projection for providing positioning with respect to the first insulating plate, and the first insulating plate has a positioning hole for housing therein the positioning projection of the at least one of the first and second heat pipes; and
a fastener integrally fastening together the first semiconductor power module and the second semiconductor power module.

* * * * *